(12) United States Patent
Kim

(10) Patent No.: US 6,923,859 B2
(45) Date of Patent: Aug. 2, 2005

(54) APPARATUS FOR MANUFACTURING GAN SUBSTRATE AND MANUFACTURING METHOD THEREOF

(75) Inventor: Chin Kyo Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 198 days.

(21) Appl. No.: 10/318,256

(22) Filed: Dec. 13, 2002

(65) Prior Publication Data

US 2003/0118746 A1 Jun. 26, 2003

(30) Foreign Application Priority Data

Dec. 20, 2001 (KR) .................................. 10-2001-0081877

(51) Int. Cl.⁷ ............................................. C30B 25/10
(52) U.S. Cl. ........................... 117/85; 117/86; 117/105; 117/201; 117/202; 117/915
(58) Field of Search .................... 117/915, 85, 86, 117/105, 952, 201, 202

(56) References Cited

U.S. PATENT DOCUMENTS 6,750,121 B1 * 6/2004 Kim ........................... 438/488
2002/0182839 A1 * 12/2002 Ogawa et al. .............. 438/604

* cited by examiner

Primary Examiner—Robert Kunemund
(74) Attorney, Agent, or Firm—Fleshner & Kim, LLP

(57) ABSTRACT

Disclosed are an apparatus for manufacturing GaN substrate and a manufacturing method thereof enabling to prevent micro-cracks or bending of a GaN substrate by separating a substrate and a GaN layer from each other after growing the GaN layer on the substrate in the same chamber. The present invention includes a chamber for loading a substrate therein, a heating means heating the chamber, a Ga boat installed inside the chamber to receive a Ga molecule producing material, an injection pipe injecting a nitrogen molecule producing gas in the chamber, the nitrogen molecule producing gas reacting chemically on the Ga molecule producing material to form a GaN layer on the substrate, and a transparent window at a circumference of the chamber to apply a laser beam to the substrate.

17 Claims, 5 Drawing Sheets

APPARATUS FOR MANUFACTURING GAN SUBSTRATE AND MANUFACTURING METHOD THEREOF

This application claims the benefit of the Korean Application No. P2001-81877 filed on Dec. 20, 2001, which is hereby incorporated by reference.

BACKGROUND OF THE INVENTION

1. Field of the Invention

The present invention relates to an apparatus for manufacturing a luminous element substrate and a manufacturing method thereof, and more particularly, to an apparatus for manufacturing GaN substrate and a manufacturing method thereof.

2. Discussion of the Related Art

As demands on short-wavelength luminous elements of high efficiency are increased lately, a bluish-purple short-wavelength luminous element becomes a matter of great interest. Specifically, a blue light-emitting diode has a long luminous time and is widely applicable to various fields such as multimedia, information communication, and the like. Such a blue light-emitting diode generates a short-wavelength of about 450 nm, thereby enabling to improve a processing rate of an information processing system as well as increase an optical record density of an optical storage device greatly.

Generally, a blue light-emitting diode requires a GaN based compound for manufacture and uses a sapphire substrate. Yet, when a GAN layer is formed on the sapphire substrate, GaN differs from the sapphire substrate in lattice constant and heat expansion coefficient to generate crystalline defects of high density. Hence, the blue light-emitting diode needs a high threshold voltage.

In order to overcome such a problem, a GaN substrate, for which single crystalline GaN is grown, is tried to use as a substrate of a luminous element. Such a GaN substrate is manufactured by growing a thick GaN layer on a transparent sapphire substrate at a high temperature of at least 1,000° C., melting an interface between the GaN layer and the sapphire substrate using a laser beam through a lift-off process to separate a GaN substrate from the sapphire substrate.

However, the GaN substrate manufacturing method according to the related art carries out the laser lift-off process at a room temperature after growing the GaN layer at the high temperature of at least 1,000° C., whereby cracks are formed on the GaN substrate due to the abrupt temperature drop or the GaN substrate is bent.

Moreover, an apparatus for manufacturing the GaN substrate used for the method according to the related art is divided into one chamber for growing the GaN layer and the other chamber for the laser lift-off process, whereby the sapphire substrate having the GaN layer grown thereon may be broken while being transferred. Besides, the temperature difference between the two chambers brings about the crack or bending of the GaN substrate.

SUMMARY OF THE INVENTION

Accordingly, the present invention is directed to an apparatus for manufacturing GaN substrate and a manufacturing method thereof that substantially obviate one or more problems due to limitations and disadvantages of the related art.

An object of the present invention is to provide an apparatus for manufacturing GaN substrate and a manufacturing method thereof enabling to prevent micro-cracks or bending of a GaN substrate due to temperature drop by separating a substrate and a GaN layer from each other inside a chamber after growing the GaN layer on the substrate inside the chamber.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an apparatus for manufacturing a GaN substrate according to the present invention includes a chamber for loading a substrate therein, a heating means heating the chamber, a Ga boat installed inside the chamber to receive a Ga molecule producing material, an injection pipe injecting a nitrogen molecule producing gas in the chamber, the nitrogen molecule producing gas reacting chemically on the Ga molecule producing material to form a GaN layer on the substrate, and a transparent window at a circumference of the chamber to apply a laser beam to the substrate.

Preferably, the apparatus further includes a holder attaching the substrate thereto to be transferred.

Preferably, the apparatus further includes an auxiliary chamber at a lateral side of the chamber to keep the substrate in store temporarily, a gate valve closing/opening a path between the chamber and the auxiliary chamber, and a bellows at a lateral side of the auxiliary chamber to maintain a vacuum state inside the auxiliary chamber.

In another aspect of the present invention, an apparatus for manufacturing a GaN substrate includes a chamber for loading a substrate therein, a heating means heating the chamber, a Ga boat installed inside the chamber to receive a Ga molecule producing material, an injection pipe spraying a nitrogen molecule producing gas on the Ga boat, a transparent window at a bottom of the chamber to apply a laser beam to the substrate in the chamber, an auxiliary chamber at a lateral side of the chamber to keep the substrate in store temporarily, a gate valve closing/opening a path between the chamber and the auxiliary chamber, and a bellows at a lateral side of the auxiliary chamber to maintain a vacuum state inside the auxiliary chamber.

In a further aspect of the present invention, an apparatus for manufacturing a GaN substrate includes a chamber for loading a substrate therein, a heating means heating the chamber, a Ga boat installed inside the chamber to receive a Ga molecule producing material, an injection pipe spraying a nitrogen molecule producing gas on the Ga boat, a transparent window at an upper portion of the chamber to apply a laser beam to the substrate in the chamber, an auxiliary chamber at a lateral side of the chamber to keep the substrate in store temporarily, a gate valve closing/opening a path between the chamber and the auxiliary chamber, a bellows at a lateral side of the auxiliary chamber to maintain a vacuum state inside the auxiliary chamber, and a holder moving the substrate horizontally and vertically, the holder turning the substrate.

In a further aspect of the present invention, a method of manufacturing a GaN substrate includes the steps of disposing a substrate on a predetermined area in a chamber having a Ga molecule producing material inside, heating the chamber, forming a GaN layer on the substrate by injecting a nitrogen molecule producing gas in the chamber, and separating the GaN layer from the substrate by applying a laser beam to the substrate through a transparent window at a bottom of the chamber.

In another further aspect of the present invention, a method of manufacturing a GaN substrate includes the steps of disposing a substrate on a predetermined area in a chamber having a Ga molecule producing material inside, heating the chamber, forming a GaN layer on the substrate by injecting a nitrogen molecule producing gas in the chamber, arranging the substrate to have a bottom of the substrate confront a transparent window at an upper portion of the chamber, and separating the GaN layer from the substrate by applying a laser beam to the substrate through the transparent window.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

First Embodiment

Figure 1:
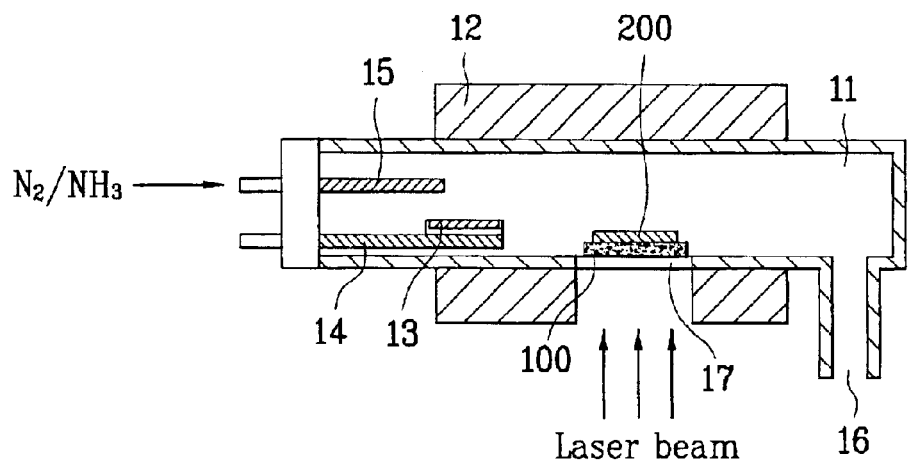
FIG. 1 illustrates a cross-sectional view of an apparatus for manufacturing a GaN substrate according to a first embodiment of the present invention.

FIG. 1 illustrates a cross-sectional view of an apparatus for manufacturing a GaN substrate according to a first embodiment of the present invention.

An apparatus for manufacturing a GaN substrate according to a first embodiment of the present invention is characterized in that a substrate and a GaN layer are separated from each other by carrying out a laser lift-off process in the same chamber without transferring the substrate having the GaN layer grown thereon.

Referring to FIG. 1, an apparatus for manufacturing a GaN substrate according to a first embodiment of the present invention includes a chamber 11 for loading a substrate 100 therein, a heating means 12 installed outside the chamber 11 to heat the chamber 11 to a high temperature of at least 1,000° C., a Ga boat 14 installed inside the chamber 11 to receive a GaN powder, a Ga powder or a mixed powder 13 of GaN and Ga for sublimating Ga molecules by a heat, an injection pipe 15 injecting a gas such as $N_2$, $NH_3$, or the like in the chamber 11 to grow a GaN layer 200 on the substrate 100 by having nitrogen molecules react chemically on the Ga molecules sublimated from the Ga boat 14, an exhaust pipe 16 discharging a gas in the chamber 11 externally, and a transparent window 17 at a lower portion of the chamber 11 to apply a laser beam to the substrate 100 having the GaN layer 200 grown thereon.

The above-constructed apparatus for manufacturing the GaN substrate according to the first embodiment of the present invention includes the transparent window 17 at the bottom of the chamber 11 having the substrate 100 loaded therein, thereby enabling to apply the laser beam to the substrate 100 without transferring the substrate 100 to another chamber after the GaN layer 200 has been formed. Therefore, the apparatus for manufacturing the GaN substrate according to the first embodiment of the present invention enables to separate the GaN layer 200 from the substrate 100 on the same condition of growing the GaN layer 200.

A method of manufacturing a GaN substrate using the apparatus according to the first embodiment of the present invention is explained as follows.

First of all, the substrate 100 is disposed on the transparent window 17 inside the chamber 11, and the chamber 11 is then heated to have a temperature of at least 1,000° C. inside. In this case, the substrate 100 is a sapphire substrate and the heating means 12 for heating the chamber 11 includes a heating furnace or a heating RF coil.

Subsequently, $N_2$ or $NH_3$ gas is injected into the heated chamber 11 through the injection pipe 15. Since the injection pipe 15 is located over the Ga boat 14, the Ga molecules sublimated from the Ga boat 14 come into collision with the $N_2$ or $NH_3$ gas. In this case, the $N_2$ or $NH_3$ gas is combined with the Ga molecules sublimated from the Ga boat 14 at the high temperature to grow the GaN layer 200 on the substrate 100.

Thereafter, after the completion of growing the GaN layer 200, the laser beam having a wavelength of 200~300 nm is applied to the substrate 100 through the transparent window 17. The laser beam melts an interface between the substrate 100 and the GaN layer 200 to separate them from each other.

Second Embodiment

Figure 2:
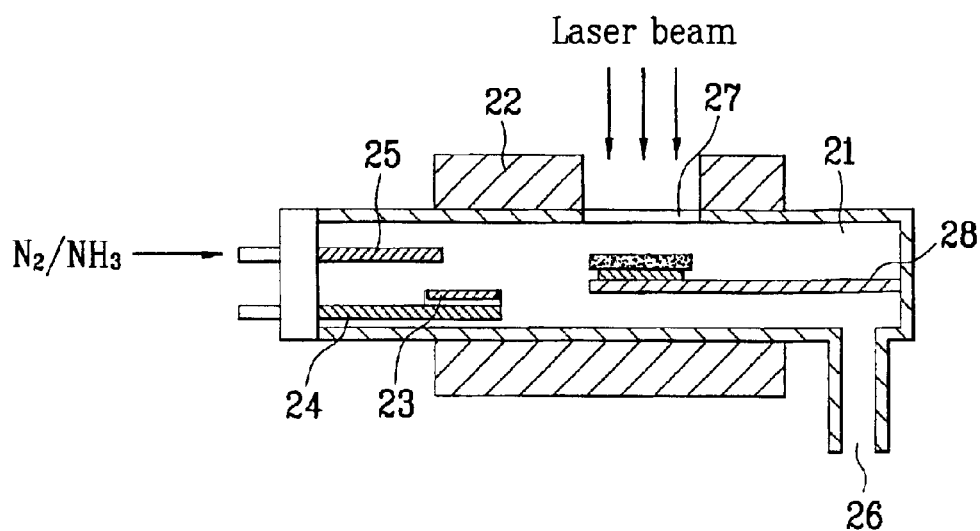
FIG. 2 illustrates a cross-sectional view of an apparatus for manufacturing a GaN substrate according to a second embodiment of the present invention.

FIG. 2 illustrates a cross-sectional view of an apparatus for manufacturing a GaN substrate according to a second embodiment of the present invention.

An apparatus for manufacturing a GaN substrate according to a second embodiment of the present invention is characterized in that a GaN layer is grown on a substrate, a bottom face of the substrate is disposed to confront a transparent window, and the substrate and the GaN layer are separated from each other by carrying out a laser lift-off process in the same chamber.

Referring to FIG. 2, an apparatus for manufacturing a GaN substrate according to a second embodiment of the present invention includes a chamber 21 for loading a substrate 100 therein, a heating means 22 installed outside the chamber 21 to heat the chamber 21 to a high temperature of at least 1,000° C., a Ga boat 24 installed inside the chamber 21 to receive a GaN powder, a Ga powder or a mixed powder 23 of GaN and Ga for sublimating Ga molecules by a heat, an injection pipe 25 injecting a gas such as $N_2$, $NH_3$, or the like in the chamber 21 to grow a GaN layer 200 on the substrate 100 by having nitrogen molecules react chemically on the Ga molecules sublimated from the Ga boat 24, an exhaust pipe 26 discharging a gas in the chamber 21 externally, a transparent window 27 at an upper portion of the chamber 21 to apply a laser beam to the substrate 100 having the GaN layer 200 grown thereon, and a holder 28 holding the substrate 100 by attaching a top of the GaN layer 200 thereto by vacuum suction and having a bottom of the substrate 100 confront the transparent window 27. In this case, the holder 28 includes a plurality of sucking pipes (not shown in the drawing) to attach the substrate thereto by vacuum suction and a sucking pump (not shown in the drawing) connected to the sucking pipes.

The above-constructed apparatus for manufacturing the GaN substrate according to the second embodiment of the present invention includes the transparent window 27 at the top of the chamber 21 having the substrate 100 loaded therein, thereby enabling to apply the laser beam to the substrate 100 disposed under the transparent window 27 by the holder 28 without transferring the substrate 100 to another chamber after the GaN layer 200 has been formed. Therefore, the apparatus for manufacturing the GaN substrate according to the second embodiment of the present invention enables to separate the GaN layer 200 from the substrate 100 on the same condition of growing the GaN layer 200.

A method of manufacturing a GaN substrate using the apparatus according to the second embodiment of the present invention is explained as follows.

First of all, the substrate 100 is disposed in the chamber 21, and the chamber 21 is then heated to have a temperature of at least 1,000° C. inside. In this case, the substrate 100 is a sapphire substrate and the heating means 22 for heating the chamber 21 includes a heating furnace or a heating RF coil.

Subsequently, $N_2$ or $NH_3$ gas is injected into the heated chamber 21 through the injection pipe 25. In this case, the $N_2$ or $NH_3$ gas is combined with the Ga molecules sublimated from the Ga boat 24 at the high temperature to grow the GaN layer 200 on the substrate 100.

After the completion of growing the GaN layer 200, the holder 28 is inserted into the chamber 21 and a top surface of the GaN layer 200 is attached to the holder 28 by vacuum suction. The holder 28 is then turned by 180° to have the bottom surface of the substrate 100 confront the transparent window 27.

Thereafter, the laser beam having a wavelength of 200~300 nm is applied to the substrate 100 through the transparent window 27. The laser beam melts an interface between the substrate 100 and the GaN layer 200 to separate them from each other.

Third Embodiment

Figure 3:
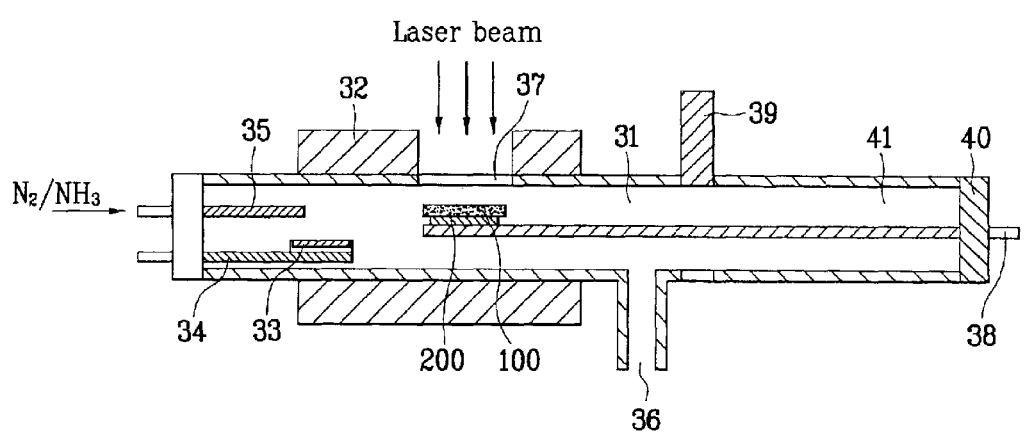
FIG. 3 illustrates a cross-sectional view of an apparatus for manufacturing a GaN substrate according to a third embodiment of the present invention.

FIG. 3 illustrates a cross-sectional view of an apparatus for manufacturing a GaN substrate according to a third embodiment of the present invention.

Referring to FIG. 3, an apparatus for manufacturing a GaN substrate according to a third embodiment of the present invention includes a chamber 31 for loading a substrate 100 therein, a heating means 32 installed outside the chamber 31 to heat the chamber 31 to a high temperature of at least 1,000° C., a Ga boat 34 installed inside the chamber 21 to receive a GaN powder, a Ga powder or a mixed powder 33 of GaN and Ga for sublimating Ga molecules by a heat, an injection pipe 35 injecting a gas such as $N_2$, $NH_3$, or the like in the chamber 31 to grow a GaN layer 200 on the substrate 100 by having nitrogen molecules react chemically on the Ga molecules sublimated from the Ga boat 34, an exhaust pipe 36 discharging a gas in the chamber 31 externally, a transparent window 37 at an upper portion of the chamber 31 to apply a laser beam to the substrate 100 having the GaN layer 200 grown thereon, an auxiliary chamber 41 keeping the substrate 100 in store before the substrate 100 is transferred into the chamber 31, a gate valve 39 opening/closing a path between the chamber 31 and the auxiliary chamber 41, and a holder 38 holding the substrate 100 by attaching a top of the GaN layer 200 thereto by vacuum suction and having a bottom of the substrate 100 confront the transparent window 37.

And, the auxiliary chamber 41 includes a bellows 40 installed at a lateral side of the auxiliary chamber 41 and having a folded pipe to maintain a vacuum state inside the auxiliary chamber 41 and a door (not shown in the drawing) for inserting the substrate 100 in the auxiliary chamber 41.

Moreover, the holder 38 is inserted into the auxiliary chamber 41 and the chamber 31 through the bellows 40. The holder 38 horizontally transfers the substrate 100 from the auxiliary chamber 41 to the chamber 31 or from the chamber 31 to the auxiliary chamber 41. The holder 38 lifts the substrate 100 vertically as well as turns the substrate 100. And, the holder 38 includes a plurality of sucking pipes (not shown in the drawing) to attach the substrate thereto by vacuum suction and a sucking pump (not shown in the drawing) connected to the sucking pipes.

A method of manufacturing a GaN substrate using the apparatus according to the third embodiment of the present invention is explained as follows.

FIGS. 4A to 4D illustrate cross-sectional views of manufacturing a GaN substrate using the manufacturing apparatus according to the third embodiment of the present invention.

Figure 4A:
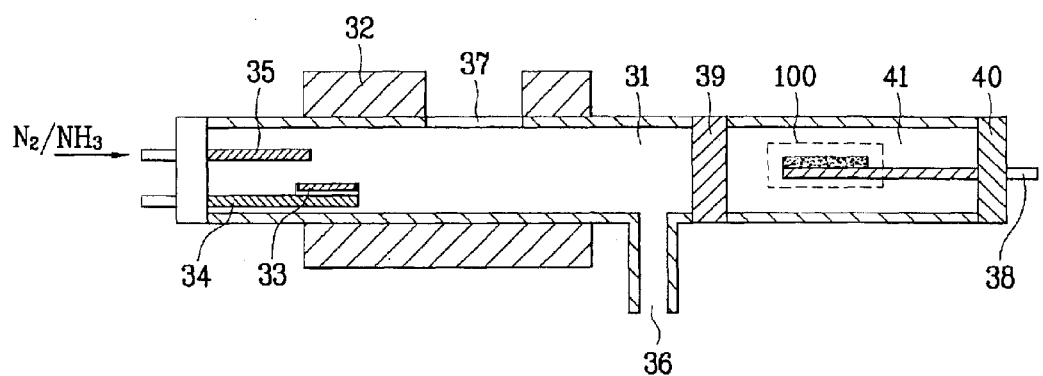
FIGS. 4A to 4D illustrate cross-sectional views of manufacturing a GaN substrate using the manufacturing apparatus according to the third embodiment of the present invention.

Referring to FIG. 4A, the holder 38 is inserted in the chamber 41 through the folded pipe of the bellows 40, and the substrate 100 is put on the holder 38 through the door installed at the auxiliary chamber 41. In this case, the holder 38 attaches the substrate 100 thereto by vacuum suction.

Figure 4B:
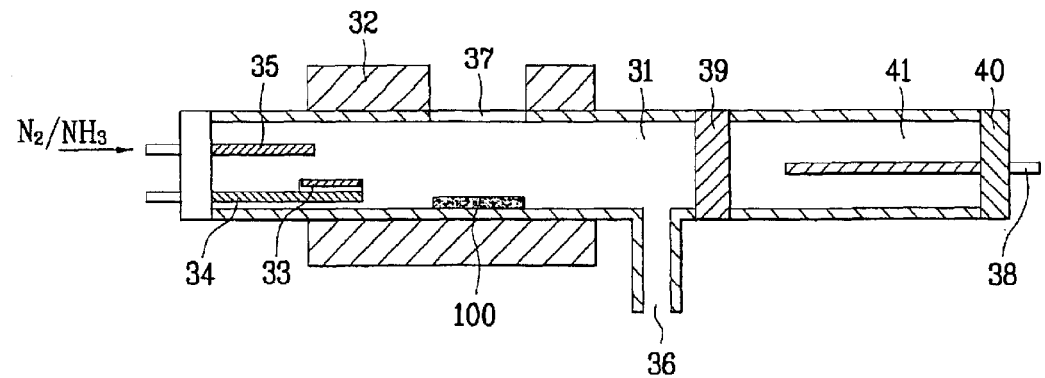

Referring to FIG. 4B, the gate valve 39 between the chamber 31 and the auxiliary chamber 41 is opened, and the holder 38 having the substrate 100 put thereon is then horizontally moved inside the chamber 31 from the auxiliary chamber 41. After the substrate 100 is loaded on the bottom of the chamber 31, the holder 38 is moved to the auxiliary chamber 41.

And, the chamber 31 is heated by the heating means 32 to have a temperature of at least 1,000° C. inside. In this case, the heating means 32 for heating the chamber 31 includes a heating furnace or a heating RF coil.

Once the temperature inside the chamber 31 increases, the Ga molecules on the Ga boat 34 in the chamber 31 are sublimated by the heat.

Subsequently, $N_2$ or $NH_3$ gas is injected into the heated chamber 31 through the injection pipe 35. The nitrogen molecules are produced by the heat to combine with the Ga molecules sublimated from the Ga boat 34. And, the combined Ga and nitrogen molecules grow the GaN layer 200 on the substrate 100.

Figure 4C:
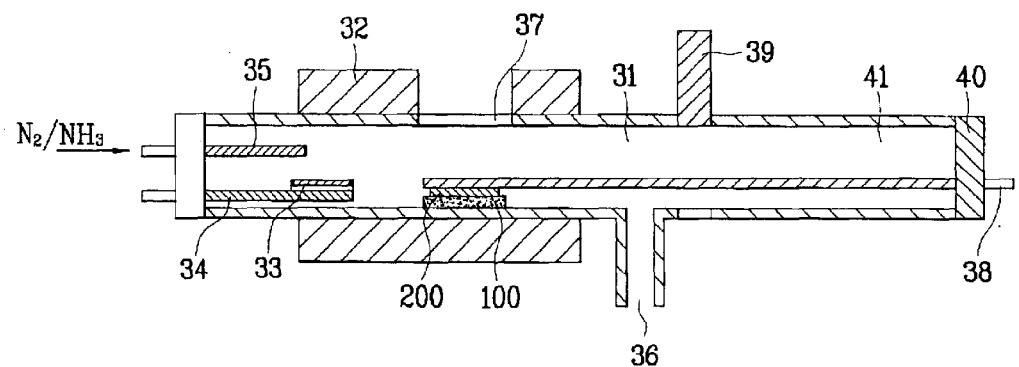

Referring to FIG. 4C, after the completion of growing the GaN layer 200, the gate valve 39 is opened. The holder 38 is then inserted into the chamber 31 to attach a top surface of the GaN layer 200 thereto by vacuum suction.

Figure 4D:
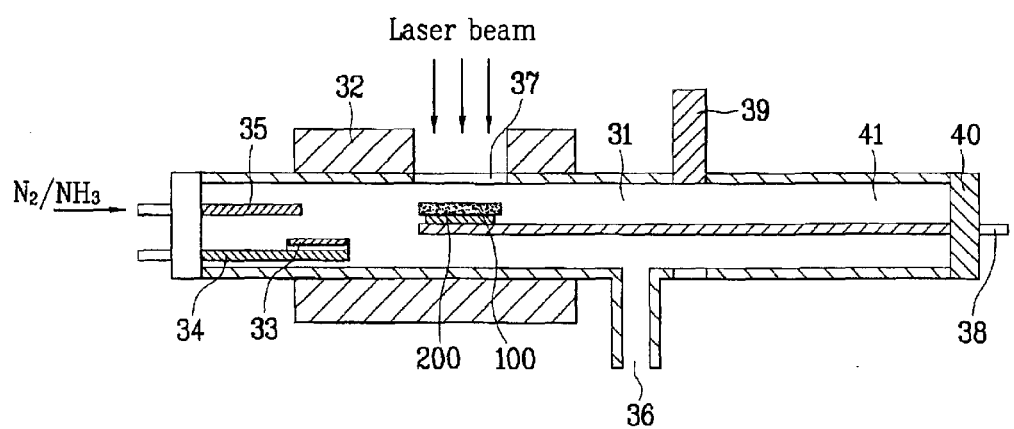

Referring to FIG. 4D, the holder 28 is turned by 180° to have the bottom surface of the substrate 100 confront the transparent window 37.

Thereafter, the laser beam having a wavelength of 200~300 nm is applied to the substrate 100 through the transparent window 37. The laser beam melts an interface between the substrate 100 and the GaN layer 200 to separate them from each other.

Fourth Embodiment

Figure 5:
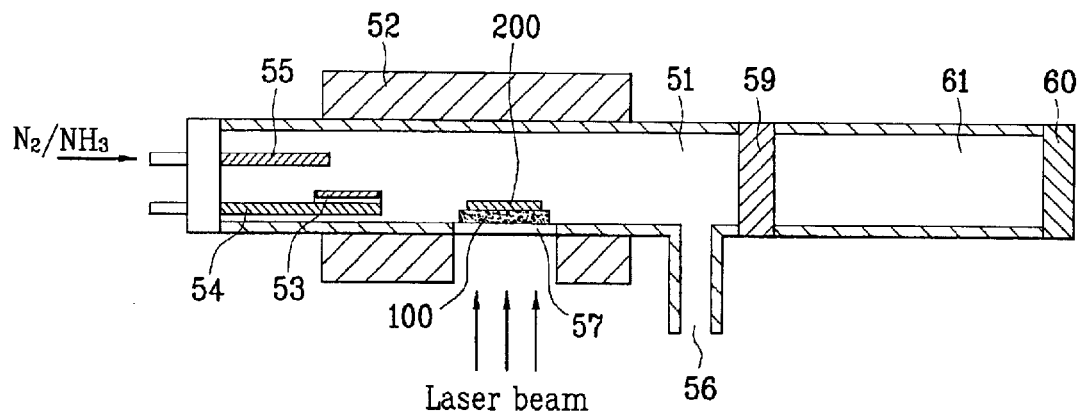
FIG. 5 illustrates a cross-sectional view of an apparatus for manufacturing a GaN substrate according to a fourth embodiment of the present invention.

FIG. 5 illustrates a cross-sectional view of an apparatus for manufacturing a GaN substrate according to a fourth embodiment of the present invention, which includes the same constituents of the third embodiment of the present invention except that a transparent window 57 is installed at a lower portion of a chamber 51.

Referring to FIG. 5, an apparatus for manufacturing a GaN substrate according to a fourth embodiment of the present invention includes a chamber 51 for loading a substrate 100 therein, a heating means 52 installed outside the chamber 51 to heat the chamber 51 to a high temperature of at least 1,000° C., a Ga boat 54 installed inside the chamber 51 to receive a GaN powder, a Ga powder or a mixed powder 53 of GaN and Ga for sublimating Ga molecules by a heat, an injection pipe 55 injecting a gas such as $N_2$, $NH_3$, or the like in the chamber 51 to grow a GaN layer 200 on the substrate 100 by having nitrogen molecules react chemically on the Ga molecules sublimated from the Ga boat 54, an exhaust pipe 56 discharging a gas in the chamber 51 externally, a transparent window 57 at a lower portion of the chamber 51 to apply a laser beam to the substrate 100 having the GaN layer 200 grown thereon, an auxiliary chamber 61 at a lateral side of the chamber 51, and a gate valve 59 opening/closing a path between the chamber 51 and the auxiliary chamber 61.

And, the auxiliary chamber 61 includes a bellows 60 installed at a lateral side of the auxiliary chamber 61 and having a folded pipe to maintain a vacuum state inside the auxiliary chamber 61 and a door (not shown in the drawing) for inserting the substrate 100 in the auxiliary chamber 61.

Meanwhile, a method of manufacturing a GaN substrate using the manufacturing apparatus according to the fourth embodiment of the present invention is equivalent to the manufacturing method using the apparatus according to the first embodiment of the present invention.

Accordingly, the present invention enables to prevent micro-cracks or bending of a GaN substrate due to temperature drop by separating a substrate and a GaN layer from each other after growing the GaN layer on the substrate inside the same chamber.

Therefore, the present invention enables to manufacture the GaN substrate of high quality.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An apparatus for manufacturing a GaN substrate, comprising:

a chamber for loading a substrate therein;

a heating means heating the chamber;

a Ga boat installed inside the chamber to receive a Ga molecule producing material;

an injection pipe injecting a nitrogen molecule producing gas in the chamber, the nitrogen molecule producing gas reacting chemically on the Ga molecule producing material to form a GaN layer on the substrate;

a transparent window at a circumference of the chamber to apply a laser beam to the substrate;

an auxiliary chamber at a lateral side of the chamber to keep the substrate in store temporarily;

a gate valve closing/opening a path between the chamber and the auxiliary chamber; and a bellows at a lateral side of the auxiliary chamber to maintain a vacuum state inside the auxiliary chamber.

2. The apparatus of claim 1, wherein the heating means is a heating furnace or a heating RF coil.

3. The apparatus of claim 1, wherein the Ga molecule producing material is a GaN powder, a Ga powder, or a mixed powder of GaN and Ga.

4. The apparatus of claim 1, wherein the nitrogen molecule producing gas is $N_2$ or $NH_3$.

5. The apparatus of claim 1, further comprising a holder attaching the substrate thereto to be transferred.

6. An apparatus for manufacturing a GaN substrate, comprising:

a chamber for loading a substrate therein;

a heating means heating the chamber;

a Ga boat installed inside the chamber to receive a Ga molecule producing material;

an injection pipe spraying a nitrogen molecule producing gas on the Ga boat;

a transparent window at a bottom of the chamber to apply a laser beam to the substrate in the chamber;

an auxiliary chamber at a lateral side of the chamber to keep the substrate in store temporarily;

a gate valve closing/opening a path between the chamber and the auxiliary chamber; and a bellows at a lateral side of the auxiliary chamber to maintain a vacuum state inside the auxiliary chamber.

7. An apparatus for manufacturing a GaN substrate, comprising:

a chamber for loading a substrate therein;

a heating means heating the chamber;

a Ga boat installed inside the chamber to receive a Ga molecule producing material;

an injection pipe spraying a nitrogen molecule producing gas on the Ga boat;

a transparent window at an upper portion of the chamber to apply a laser beam to the substrate in the chamber;

an auxiliary chamber at a lateral side of the chamber to keep the substrate in store temporarily;

a gate valve closing/opening a path between the chamber and the auxiliary chamber;

a bellows at a lateral side of the auxiliary chamber to maintain a vacuum state inside the auxiliary chamber; and a holder moving the substrate horizontally and vertically, the holder turning the substrate.

8. The apparatus of claim 7, wherein the holder attaches the substrate thereto by vacuum suction.

9. A method of manufacturing a GaN substrate, comprising the steps of:

disposing a substrate on a predetermined area in a chamber having a Ga molecule producing material inside;

heating the chamber;

forming a GaN layer on the substrate by injecting a nitrogen molecule producing gas in the chamber;

separating the GaN layer from the substrate by applying a laser beam to the substrate through a transparent window at a bottom of the chamber;

disposing an auxiliary chamber at a lateral side of the chamber to keep the substrate in store temporarily;

selectively closing/opening a path between the chamber and the auxiliary chamber using a gate valve; and maintaining a vacuum state inside the auxiliary chamber using a bellows at a lateral side of the auxiliary chamber.

10. The method of claim 9, wherein the Ga molecule producing material is selected from the group consisting of a GaN powder, a Ga powder, and a mixed powder of GaN and Ga.

11. The method of claim 9, wherein the nitrogen molecule producing gas is $N_2$ or $NH_3$, and wherein the forming and separating steps are performed in the identical condition in the chamber.

12. The method of claim 9, wherein the substrate is a sapphire substrate.

13. A method of manufacturing a GaN substrate, comprising the steps of:

disposing a substrate on a predetermined area in a chamber having a Ga molecule producing material inside;

heating the chamber, forming a GaN layer on the substrate by injecting a nitrogen molecule producing gas in the chamber;

arranging the substrate to have a bottom of the substrate confront a transparent window at an upper portion of the chamber;

separating the GaN layer from the substrate by applying a laser beam to the substrate through the transparent window;

disposing an auxiliary chamber at a lateral side of the chamber to keep the substrate in store temporarily;

selectively closing/opening a path between the chamber and the auxiliary chamber using a gate valve; and maintaining a vacuum state inside the auxiliary chamber using a bellows at a lateral side of the auxiliary chamber.

14. The method of claim 13, wherein a holder attaches the substrate thereto by vacuum suction to move the substrate horizontally and vertically, wherein the holder having the substrate attached thereto is turned over to have the bottom of the substrate confront the transparent window.

15. The method of claim 13, wherein the Ca molecule producing material is selected from the group consisting of a GaN powder, a Ga powder, and a mixed powder of GaN and Ga.

16. The method of claim 13, wherein the nitrogen molecule producing gas is $N_2$ or $NH_3$, and wherein the forming and separating steps are performed in a continuous identical condition in the chamber.

17. The method of claim 13, wherein the substrate is a sapphire substrate.

* * * * *